(12) United States Patent
Chiozzi et al.

(10) Patent No.: US 6,362,036 B1
(45) Date of Patent: Mar. 26, 2002

(54) VDMOS TRANSISTOR PROTECTED AGAINST OVER-VOLTAGES BETWEEN SOURCE AND GATE

(75) Inventors: Giorgio Chiozzi, Cinisello Balsamo; Antonio Andreini, Usmate, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/756,886

(22) Filed: Jan. 9, 2001

Related U.S. Application Data

(62) Division of application No. 09/232,336, filed on Jan. 15, 1999, now Pat. No. 6,194,761.

(30) Foreign Application Priority Data

Feb. 10, 1998 (EP) .............................................. 98830056

(51) Int. Cl.$^7$ .......................................... H01L 21/8238
(52) U.S. Cl. ........................ 438/206; 438/208; 438/268
(58) Field of Search ................................. 438/206, 207, 438/208, 212, 268

(56) References Cited

U.S. PATENT DOCUMENTS

| 4,325,180 A | * | 4/1982 | Curran | 438/206 |
| 4,814,288 A | * | 3/1989 | Kimura et al. | 438/206 |
| 5,432,371 A | | 7/1995 | Denner et al. | 257/409 |
| 5,525,832 A | | 6/1996 | Consiglio et al. | 257/544 |
| 5,589,405 A | * | 12/1996 | Contiero et al. | 438/268 |

FOREIGN PATENT DOCUMENTS

JP     3-205876     9/1991     ......... H01L/29/784

* cited by examiner

*Primary Examiner*—Chandra Chaudhari
(74) *Attorney, Agent, or Firm*—Lisa K. Jorgenson; Allen, Dyer, Doppelt, Milbrath & Gilchrist, P.A.

(57) ABSTRACT

The n-channel VDMOS transistor is formed in an n-type active region of an integrated circuit with junction isolation. To prevent over-voltages between source and gate which could damage or destroy the gate dielectric, a p-channel MOS transistor is formed in the same active region and has its gate electrode connected to the gate electrode of the VDMOS transistor, its source region in common with the source region of the VDMOS transistor, and its drain region connected to the p-type junction-isolation region. The p-channel MOS transistor has a threshold voltage below the breakdown voltage of the gate dielectric of the VDMOS transistor so that it acts as a voltage limiter.

29 Claims, 3 Drawing Sheets

VDMOS TRANSISTOR PROTECTED AGAINST OVER-VOLTAGES BETWEEN SOURCE AND GATE

This application is a division of Ser. No. 09/232,336 filed on Jan. 15, 1999 now U.S. Pat. No. 6,194,761.

FIELD OF THE INVENTION

The present invention relates to semiconductor devices, and, more particularly, to a VDMOS transistor in an integrated circuit.

BACKGROUND OF THE INVENTION

In some circuit applications for vertical double-diffusion MOS (VDMOS) transistors, the voltage between the gate and source electrodes may reach values very close to the breakdown voltage of the gate dielectric. This may cause degradation of the dielectric, or may even reach the breakdown value of the gate dielectric so that the transistor becomes unusable.

A known circuit which uses a VDMOS transistor is shown schematically in FIG. 1. It is a current generator comprising an npn bipolar transistor, indicated T1, and an n-channel VDMOS transistor, indicated T2, connected to the npn transistor in a "cascode" arrangement. The emitter of the npn transistor is connected to a supply terminal, indicated by the ground symbol. The drain terminal of the VDMOS transistor is connected, via a load RL, to a second supply terminal, indicated VDD. A predetermined voltage VR is applied to the base of the npn transistor and the gate terminal of the VDMOS transistor is connected to a reference-voltage generator represented by a Zener diode DZ in series with a constant-current generator G.

Between the collector of the npn transistor T1 and the ground terminal there is a parasitic diode D1 which represents the reverse-biased junction between the n-type collector region and the integrated circuit p-type substrate, which is connected to the ground terminal as is the emitter of the transistor. Between the drain and source terminals of the VDMOS transistor T2 there is a further parasitic diode D2 which represents the reverse-biased junction between the body region of the transistor, which is in contact with the source electrode, and the drain region of the transistor.

The circuit described above can supply to the load RL a current having a value which depends upon the supply voltage VDD, upon the voltage VR, and upon the reverse-conduction threshold of the Zener diode DZ. A particularly critical operating condition arises when the transistor T1 is cut off. In this situation, the generator current results solely from the leakage currents of the two diodes D1 and D2. A voltage which depends upon the supply voltage VDD and upon the equivalent resistances of the two reverse-biased diodes is established between the circuit node N, which is the connecting point between the collector of the transistor T1 and the source of the transistor T2, and ground.

These equivalent resistances may vary considerably from one example of the integrated circuit to another. This is so because of inevitable variations in manufacturing parameters and, in some cases, the potential of the node N, since a given supply voltage VDD may reach quite high values. Situations may therefore arise in which the voltage between the node N, that is, between the source terminal of the transistor T2 and the gate terminal of the transistor, approach or reach the breakdown voltage of the gate dielectric.

A known measure for attempting to prevent the dangerous situation described above is that of connecting between the source and gate terminals of the VDMOS transistor a voltage-limiting device. This may be, for example, a diode which has a predetermined reverse-conduction voltage and which becomes conductive at a voltage between the source and gate and lower than that considered dangerous to the VDMOS transistor. Naturally, this approach applies not only to the current generator described above but, more generally, to the protection of VDMOS transistors in all applications in which the voltage between the source and gate may reach dangerous values. However, the voltage limiter and the respective connections take up additional area on the semiconductor chip containing the integrated circuit.

SUMMARY OF THE INVENTION

The object of the present invention is to provide a method for making a VDMOS transistor in an integrated circuit of the type defined above in which the protection of the transistor does not require the use of additional area.

This object is achieved by a method for making VDMOS transistor structure comprising a VDMOS transistor and MOS transistor formed in the same active region to prevent over-voltages between the source and gate of the VDMOS transistor. More particularly, the VDMOS transistor is formed in a semiconductor layer of first conductivity type on a substrate of second conductivity type. The method may include forming a first region of first conductivity type extending into the semiconductor layer from a major surface thereof farther from the substrate; forming a second region of second conductivity type extending from the major surface into the semiconductor layer around the first region and laterally limiting the first region; forming a third region of second conductivity type extending from the major surface into the first region and defining a body region of a VDMOS transistor; forming a fourth region of first conductivity type extending from the major surface into the third region and defining a source region of the VDMOS transistor, the fourth region also defining a first channel with edges of the third region; and forming a fifth region of first conductivity type extending from the major surface into the first region, the first region and the fifth region together defining a drain region of the VDMOS transistor. The method may also include forming a sixth region of second conductivity type extending from the major surface into the first region, in contact with the second region, and delimiting a second channel with an edge of the third region. The third region and the sixth region may define source and drain regions of a MOS transistor, respectively. In addition, the MOS transistor may have a threshold voltage lower than a breakdown voltage between the source and gate of the VDMOS transistor so that the MOS transistor acts as a voltage limiter as defined and characterized.

BRIEF DESCRIPTION OF THE DRAWINGS

The invention will be understood better from the following detailed description of an embodiment thereof, given by way of non-limiting example with reference to the appended drawings, in which.

DETAILED DESCRIPTION OF THE PREFERRED EMBODIMENTS

Figure 2:
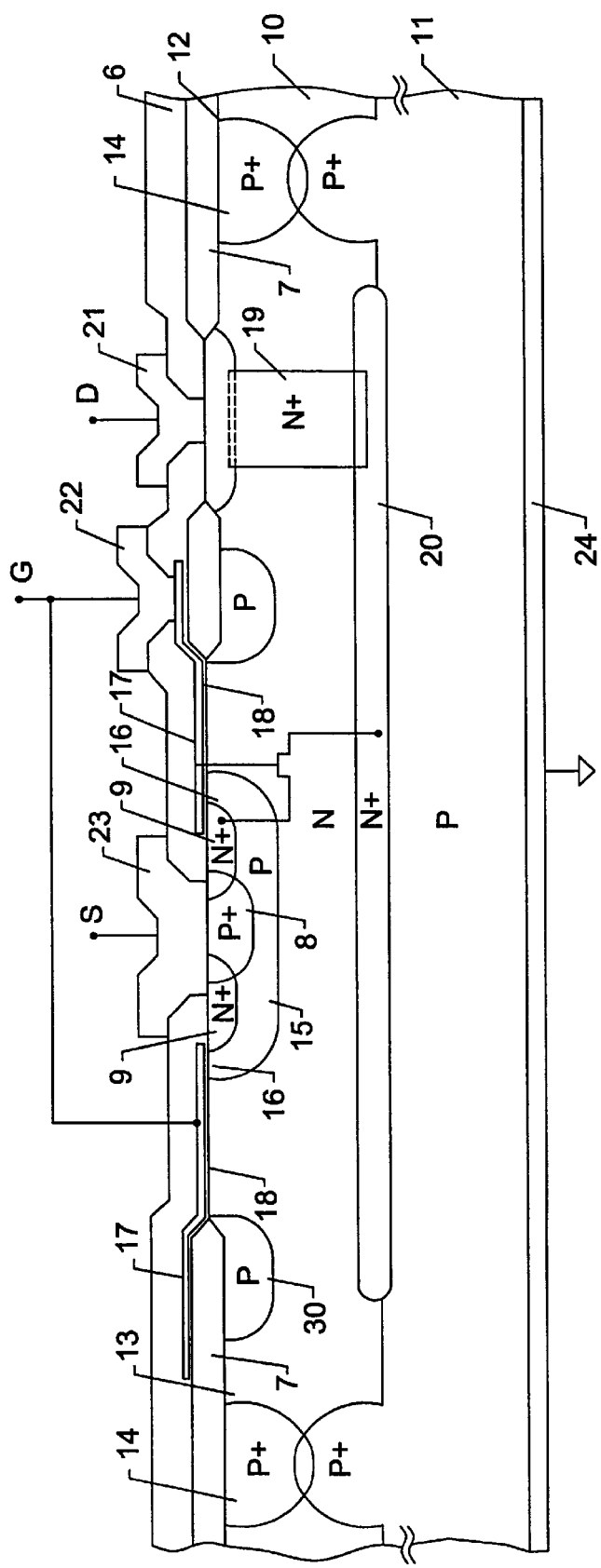
FIG. 2 is a section through a portion of an integrated circuit showing the structure of a known VDMOS transistor as in the prior art.

The known VDMOS transistor shown in FIG. 2 is formed in an epitaxial silicon layer 10 with n-type conductivity formed on a monocrystalline silicon substrate 11 with p-type conductivity, and has a major surface 12. It comprises the following regions:

- a first, n-type region 13 which is a portion of the epitaxial layer 10 and provides the drain region of the VDMOS transistor;
- a second, p-type region 14 which is strongly doped and hence is indicated P+, and which extends from the major surface 12 into the epitaxial layer 10, around the first region 13, to limit it laterally and to isolate it from the rest of the epitaxial layer 10;
- a third, p-type region 15 which extends from the major surface 12 into the first region 13 and defines the body region of the VDMOS transistor;
- a fourth, n-type region 9 which extends from the major surface into the third region 15 and defines, with the edges of the latter, the channel 16 of the VDMOS transistor;
- a layer 17 of electrically-conductive material, for example polycrystalline silicon, which extends over the major surface, separated therefrom by a thin layer 18 of insulating material, for example, silicon dioxide, so as to lie above the channel 16 and to define the gate electrode of the transistor;
- a fifth, n-type region 19, indicated N+, which is strongly-doped and thus has lower resistivity than the first region 13, and which extends in the first region 13, in this embodiment extending through its entire depth to be joined to a buried n-type layer 20 also having lower resistivity than the first region 13 and extending between the first region and the substrate 11;
- a first metal electrode 21 in ohmic contact with the surface of the fifth region 19 and connected to the drain terminal D of the VDMOS transistor;
- a second metal electrode 22 in contact with the electrically-conductive gate layer 17 and connected to the gate terminal G of the VDMOS transistor;
- a third metal electrode 23 in ohmic contact with the surface of the source region 9 and with the surface of the body region 15 by a p-type region 8 of low resistivity, and connected to the source terminal S of the VDMOS transistor; and
- a fourth metal electrode 24 in ohmic contact with the major surface of the substrate and connected to a terminal common to the entire integrated circuit, indicated by the ground symbol.

As shown in FIG. 2, the transistor is formed within a so-called active region of the epitaxial layer 10 which is electrically isolated from the rest of the epitaxial layer by the junction isolation achieved by the biasing of the second p-type region 14 to a potential, usually the ground potential, lower than that of the first n-type region 13. Moreover, this active region is separated superficially from other active regions by relatively thick plates of silicon dioxide, the so-called field oxide, indicated 7, which are partially sunk into the epitaxial layer. This structure is achieved by the known technique of growth of the silicon by selective oxidation at high temperature. A further silicon-dioxide layer 6 covers the entire structure leaving only the openings necessary for the contacts of the electrodes 21, 22 and 23.

To improve the resistance of the VDMOS transistor to high voltages, that is, to increase the breakdown voltage in the body/drain junction, it is known to use electrically-conductive plates known as "field plates", usually of polycrystalline silicon. The field plates extend over the line of intersection of the body/drain junction with the surface of the epitaxial silicon layer and are biased to modify the shape of the electric field on the surface in a manner such as to prevent local concentrations of electric field lines.

Moreover, in conditions of high reverse voltages across the body/drain junction, an intense electric field also arises in the surface regions disposed below the transition regions from the thin gate-oxide layer to the thick field-oxide layer. Accordingly, it is also known to form field plates above these regions. To do this, in practice, it is often advantageous to extend the gate electrode over the field oxide as shown in the example of FIG. 2.

To further reduce the electric field locally, another known measure provides for the formation of a diffused region which extends under the field oxide and surrounds the active area along its entire perimeter. A p-type region of this type is indicted 30 in FIG. 2.

Figure 3:
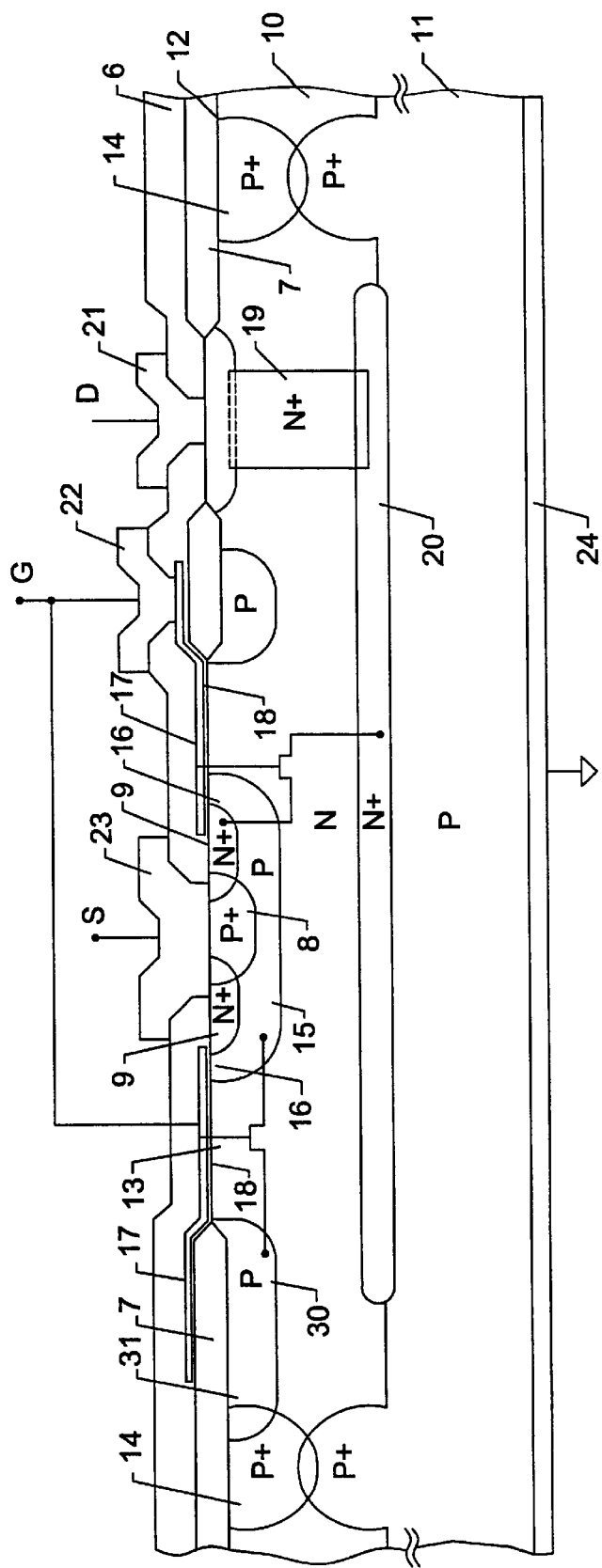
FIG. 3 is a section through a portion of an integrated circuit showing the structure of a VDMOS transistor according to the invention.

According to the invention, as shown in FIG. 3, in which elements the same as those of FIG. 2 are indicated by the same reference numerals, the region 30 is enlarged for a portion of its perimeter, indicated 31, to merge with the isolation region 14. It can be seen that the diffused region 30, 31 defines the drain region of a p-channel lateral MOS transistor having, as its source region, the body region 15 of the n-channel VDMOS transistor and, as its channel, the surface region of the epitaxial layer disposed between the edge of the body region 15 and the diffused region 30, 31. This MOS transistor has its gate and source electrodes connected to the gate and source electrodes of the VDMOS transistor, respectively. Its drain electrode is connected by the isolation region 14 and the substrate 11 to the fourth electrode 24 on the bottom surface of the substrate 11.

Figure 1:
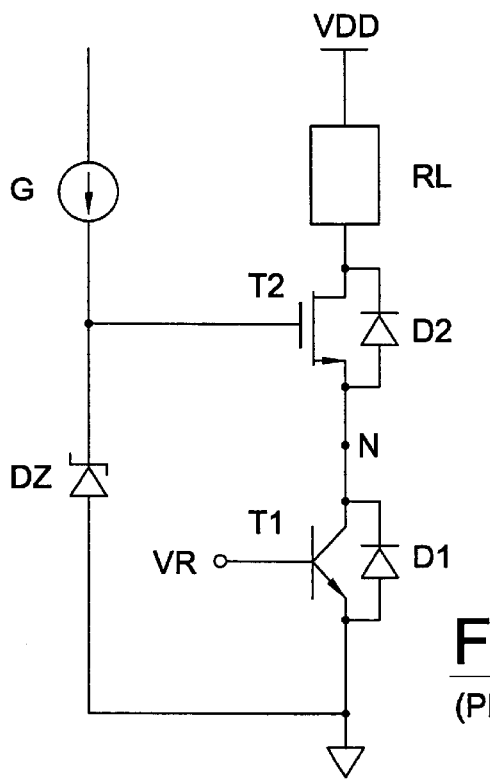
FIG. 1 is a circuit diagram of a known current generator as in the prior art.
Figure 4:
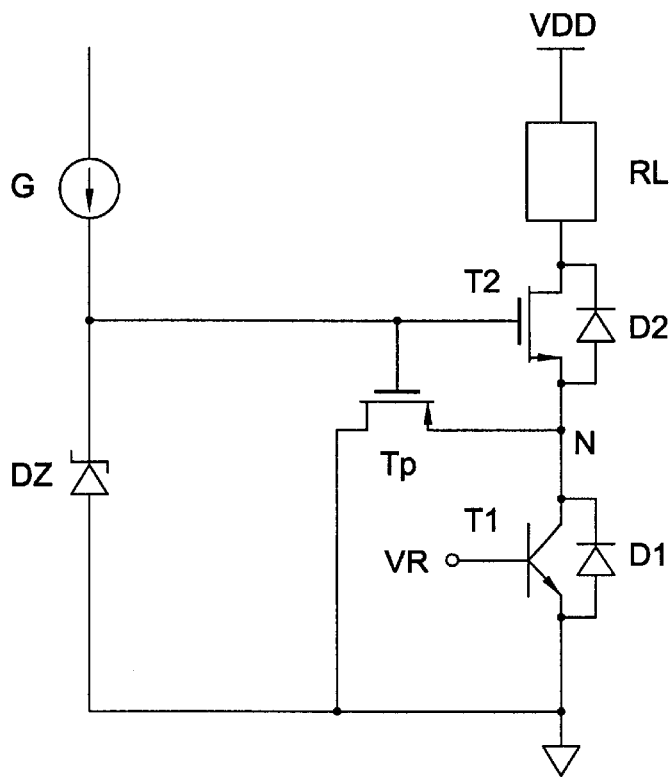
FIG. 4 is a circuit diagram of a current generator comprising the protected VDMOS transistor according to the invention.

In the case of a generator such as that of FIG. 1 which uses the VDMOS transistor of FIG. 3 as the VDMOS transistor, the equivalent circuit diagram comprises, as shown in FIG. 4, the p-channel MOS transistor described above, indicated Tp in the drawing. By suitable selection of the geometrical and physical parameters, that is, of the dimensions of the various regions, of their resistivity and of their mutual spacing, it is possible to arrange for the threshold voltage of the p-channel MOS transistor to be lower than the breakdown voltage (Vgs) between the source and the gate of the VDMOS transistor in all operating conditions. In a typical 100V process, that is, a process such as to produce VDMOS transistors which can withstand voltages of up to 100V between source and drain, the maximum voltage Vgs permitted was about 20V. In addition, the threshold voltage of the p-channel MOS transistor barely reached 10V when its body region, that is, the drain region 13 of the VDMOS transistor, was 100V higher than the source region.

The VDMOS transistor is thus clearly protected since the voltage between its source and gate can never reach values close to the breakdown voltage of the gate dielectric. It is also clear that this is achieved without the addition of special steps to the normal manufacturing process. This is so since the p-channel MOS transistor is formed by a simple modification of the "layout" and without the use of additional area of the integrated circuit because, as can be seen, the limiting device, that is, the p-channel MOS transistor, is within the structure of the VDMOS transistor.

It should be noted that the p-channel MOS transistor is intrinsically of the high-voltage type. This is so since it has a drain region of differentiated resistivity, more precisely, with greater resistivity (less doping) in the region adjacent the channel. It does not therefore in any way compromise the voltage strength of the VDMOS transistor.

Although only one embodiment of the invention has been described and illustrated, many variations and modifications are possible within the scope of the same inventive concept. For example, the dielectrics and the gate electrodes of the VDMOS transistor and of the p-channel MOS transistor could be formed separately and could have different thicknesses instead of being formed by the same silicon dioxide and polycrystalline layers, respectively, as in the embodiment described. Moreover, all of the regions could have conductivities of the opposite types to those of the embodiment described so that, instead of an n-channel VDMOS transistor with a p-channel MOS protection transistor, there would be a p-channel VDMOS transistor with an n-channel MOS protection transistor.

That which is claimed is:

1. A method for making a VDMOS transistor structure comprising:

forming a semiconductor layer of first conductivity type on a substrate of second conductivity type;

forming a first region of first conductivity type extending into the semiconductor layer from a major surface thereof farther from the substrate;

forming a second region of second conductivity type extending from the major surface into the semiconductor layer around the first region and laterally limiting the first region;

forming a third region of second conductivity type extending from the major surface into the first region and defining a body region of a VDMOS transistor;

forming a fourth region of first conductivity type extending from the major surface into the third region and defining a source region of the VDMOS transistor, the fourth region also defining a first channel with edges of the third region;

forming a fifth region of first conductivity type and extending from the major surface into the first region, the first region and the fifth region together defining a drain region of the VDMOS transistor; and forming a sixth region of second conductivity type extending from the major surface into the first region, in contact with the second region, and delimiting a second channel with an edge of the third region, the third region and the sixth region respectively defining source and drain regions of a MOS transistor which acts as a voltage limiter for the VDMOS transistor.

2. A method according to claim 1 further comprising selecting at least one parameter so that the MOS transistor has a threshold voltage lower than a breakdown voltage between the source and gate of the VDMOS transistor.

3. A method according to claim 2 wherein the at least one parameter comprises at least one of a geometrical and physical parameter.

4. A method according to claim 1 further comprising:

forming a first insulating layer extending over the major surface at least over the first channel;

forming a first electrically conductive layer extending over the first insulating layer at least over the first channel.

5. A method according to claim 4 further comprising:

forming a second insulating layer extending at least over the second channel; and forming a second electrically conductive layer extending at least over the second channel, the second electrically conductive layer defining a gate electrode of the MOS transistor.

6. A method according to claim 5 further comprising forming a third relatively thick insulating layer extending over the major surface over the sixth region substantially as far as an edge thereof; and wherein the second electrically conductive layer also extends over the third relatively thick insulating layer.

7. A method according to claim 5 wherein the first electrically conductive layer and the second electrically conductive layer are a single piece.

8. A method according to claim 1 further comprising forming a buried layer of first conductivity type and having a lower resistivity than the first region, and which extends between the first region and the substrate.

9. A method according to claim 8 wherein the fifth region extends as far as the buried region.

10. A method according to claim 1 wherein forming the fifth region comprises forming the fifth region to have a lower resistivity than the first region.

11. A method for making a VDMOS transistor structure comprising:

forming a semiconductor layer of first conductivity type on a substrate of second conductivity type;

forming a first region of first conductivity type extending into the semiconductor layer from a major surface thereof farther from the substrate;

forming a second region of second conductivity type extending from the major surface into the semiconductor layer around the first region and laterally limiting the first region;

forming a third region of second conductivity type extending from the major surface into the first region and defining a body region of a VDMOS transistor;

forming a fourth region of first conductivity type extending from the major surface into the third region and defining a source region of the VDMOS transistor, the fourth region also defining a first channel with edges of the third region;

forming a fifth region of first conductivity type having lower resistivity than the first region and extending from the major surface into the first region, the first region and the fifth region together defining a drain region of the VDMOS transistor;

forming a sixth region of second conductivity type extending from the major surface into the first region, in contact with the second region, and delimiting a second channel with an edge of the third region, the third region and the sixth region respectively defining source and drain regions of a MOS transistor; and selecting at least one parameter so that the MOS transistor has a threshold voltage lower than a breakdown voltage between the source and gate of the VDMOS transistor to thereby act as a voltage limiter for the VDMOS transistor.

12. A method according to claim 11 wherein the at least one parameter comprises at least one of a geometrical and physical parameter.

13. A method according to claim 11 further comprising:

forming a first insulating layer extending over the major surface at least over the first channel;

forming a first electrically conductive layer extending over the first insulating layer at least over the first channel.

14. A method according to claim 13 further comprising:

forming a second insulating layer extending at least over the second channel; and forming a second electrically conductive layer extending at least over the second channel, the second electrically conductive layer defining a gate electrode of the MOS transistor.

15. A method according to claim 14 further comprising forming a third relatively thick insulating layer extending over the major surface over the sixth region substantially as far as an edge thereof; and wherein the second electrically conductive layer also extends over the third relatively thick insulating layer.

16. A method according to claim 15 wherein the first electrically conductive layer and the second electrically conductive layer are a single piece.

17. A method according to claim 11 further comprising forming a buried layer of first conductivity type and having a lower resistivity than the first region, and which extends between the first region and the substrate.

18. A method according to claim 17 wherein the fifth region extends as far as the buried region.

19. A method for making an integrated circuit current generator comprising:
  forming a semiconductor layer of first conductivity type on a substrate of second conductivity type; and
  forming a bipolar transistor and a VDMOS transistor structure connected thereto, forming the VDMOS transistor structure comprising
    forming a semiconductor layer of first conductivity type on a substrate of second conductivity type,
    forming a first region of first conductivity type extending into the semiconductor layer from a major surface thereof farther from the substrate,
    forming a second region of second conductivity type extending from the major surface into the semiconductor layer around the first region and laterally limiting the first region,
    forming a third region of second conductivity type extending from the major surface into the first region and defining a body region of a VDMOS transistor,
    forming a fourth region of first conductivity type extending from the major surface into the third region and defining a source region of the VDMOS transistor, the fourth region also defining a first channel with edges of the third region,
    forming a fifth region of first conductivity type and extending from the major surface into the first region, the first region and the fifth region together defining a drain region of the VDMOS transistor, and
    forming a sixth region of second conductivity type extending from the major surface into the first region, in contact with the second region, and delimiting a second channel with an edge of the third region, the third region and the sixth region respectively defining source and drain regions of a MOS transistor which acts as a voltage limiter for the VDMOS transistor.

20. A method according to claim 19 wherein forming the VDMOS transistor structure further comprises selecting at least one parameter so that the MOS transistor has a threshold voltage lower than a breakdown voltage between the source and gate of the VDMOS transistor.

21. A method according to claim 20 wherein the at least one parameter comprises at least one of a geometrical and physical parameter.

22. A method according to claim 19 wherein forming the VDMOS transistor structure further comprises:
  forming a first insulating layer extending over the major surface at least over the first channel;
  forming a first electrically conductive layer extending over the first insulating layer at least over the first channel.

23. A method according to claim 22 wherein forming the VDMOS transistor structure further comprises:
  forming a second insulating layer extending at least over the second channel; and
  forming a second electrically conductive layer extending at least over the second channel, the second electrically conductive layer defining a gate electrode of the MOS transistor.

24. A method according to claim 23 wherein forming the VDMOS transistor structure further comprises forming a third relatively thick insulating layer extending over the major surface over the sixth region substantially as far as an edge thereof; and wherein the second electrically conductive layer also extends over the third relatively thick insulating layer.

25. A method according to claim 23 wherein the first electrically conductive layer and the second electrically conductive layer are a single piece.

26. A method according to claim 19 wherein forming the VDMOS transistor structure further comprises forming a buried layer of first conductivity type and having a lower resistivity than the first region, and which extends between the first region and the substrate.

27. A method according to claim 26 wherein the fifth region extends as far as the buried region.

28. A method according to claim 19 wherein forming the fifth region comprises forming the fifth region to have a lower resistivity than the first region.

29. A method according to claim 19 further comprising forming a zener diode connected between an emitter of the bipolar transistor and a gate of the VDMOS transistor.

* * * * *

UNITED STATES PATENT AND TRADEMARK OFFICE
CERTIFICATE OF CORRECTION

PATENT NO. : 6,362,036 B1  
DATED : March 26, 2002  
INVENTOR(S) : Giorgio Chiozzi and Antonio Andreini It is certified that error appears in the above-identified patent and that said Letters Patent is hereby corrected as shown below:

<u>Column 2,</u>
Line 49, delete "voltage limiter as defined and charaterized." insert -- voltage limiter. --

Signed and Sealed this

Nineteenth Day of November, 2002

Attest:

Attesting Officer

JAMES E. ROGAN  
Director of the United States Patent and Trademark Office